United States Patent
Lee et al.

(10) Patent No.: US 8,946,077 B2
(45) Date of Patent: Feb. 3, 2015

(54) METHOD OF MANUFACTURING A SEMICONDUCTOR DEVICE

(71) Applicant: Samsung Electronics Co., Ltd., Suwon-si, Gyeonggi-do (KR)

(72) Inventors: Hyeon-Kyu Lee, Suwon-si (KR); Bo-Young Song, Seongnam-si (KR); Seung-Hee Ko, Seogwipo-si (KR); Jin-A Kim, Seoul (KR); Hyun-Gi Kim, Hwaseong-si (KR); Cheol-Ju Yun, Suwon-si (KR); Chae-Ho Lim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/158,223

(22) Filed: Jan. 17, 2014

(65) Prior Publication Data

US 2014/0206186 A1       Jul. 24, 2014

(30) Foreign Application Priority Data

Jan. 22, 2013   (KR) .......................... 10-2013-0007089

(51) Int. Cl.
*H01L 21/4763*       (2006.01)
*H01L 21/768*        (2006.01)

(52) U.S. Cl.
CPC .... *H01L 21/76829* (2013.01); *H01L 21/76802* (2013.01); *H01L 21/76877* (2013.01)
USPC ............ 438/637; 438/638; 438/639; 438/640

(58) Field of Classification Search
USPC .................................................. 438/637–640
See application file for complete search history.

(56) References Cited

U.S. PATENT DOCUMENTS

| | | | |
|---|---|---|---|
| 7,824,983 B2 | 11/2010 | Juengling | |
| 2006/0258145 A1* | 11/2006 | Lee et al. | 438/618 |
| 2008/0124893 A1* | 5/2008 | Kim et al. | 438/426 |
| 2008/0268612 A1 | 10/2008 | Cho et al. | |
| 2011/0024833 A1 | 2/2011 | Jang | |

FOREIGN PATENT DOCUMENTS

| | | |
|---|---|---|
| KR | 1020040079176 | 9/2004 |
| KR | 1020090128914 | 12/2009 |
| KR | 1020100025782 | 3/2010 |
| KR | 1020110024488 | 3/2011 |
| KR | 1020110077432 | 7/2011 |

* cited by examiner

*Primary Examiner* — Karen Kusumakar
(74) *Attorney, Agent, or Firm* — F. Chau & Associates, LLC

(57) ABSTRACT

A method of manufacturing a semiconductor device includes forming a plurality of conductive lines separated from one another in a first direction via a slender hole and extending in a second direction perpendicular to the first direction, forming a first insulation layer filling the slender hole between the plurality of conductive lines, forming a plurality of first isolated holes separated from one another between the plurality of conductive lines in the first direction and the second direction by patterning the first insulation layer, forming a liner layer in the first isolated holes, filling a second insulation layer having an etching selectivity with respect to the first insulation layer, in the first isolated holes on the liner layer and forming a plurality of second isolated holes between the conductive lines by removing the first insulation layer using the etching selectivity between the second insulation layer and the first insulation layer.

20 Claims, 20 Drawing Sheets

METHOD OF MANUFACTURING A SEMICONDUCTOR DEVICE

CROSS-REFERENCE TO RELATED APPLICATIONS

This application claims priority to Korean Patent Application No. 10-2013-0007089, filed on Jan. 22, 2013, the disclosure of which is hereby incorporated by reference herein in its entirety.

(i) TECHNICAL FIELD

The present disclosure relates to a method of manufacturing a semiconductor device, and more particularly, to a method of manufacturing a semiconductor device, in which a hole or a contact plug may be easily formed in a highly integrated semiconductor device.

(ii) DISCUSSION OF THE RELATED ART

With an increase in an integration degree of semiconductor devices, the design rules for elements of the semiconductor devices are being reduced. A separation distance between a plurality of conductive lines in a highly integrated semiconductor device is gradually decreasing. Consequently, as a result, it may be difficult to form holes or contact plugs between the conductive lines which connect to upper conductive lines thereabove.

SUMMARY

Exemplary embodiments of the inventive concept provide a method of manufacturing a semiconductor device, in which a hole or a contact plug may be readily formed in a highly integrated semiconductor device.

According to an aspect of the inventive concept, there is provided a method of manufacturing a semiconductor device. The method includes forming a plurality of conductive lines separated from one another in a first direction via a slender hole and extending in a second direction perpendicular to the first direction, forming a first insulation layer filling the slender hole between the plurality of conductive lines, forming a plurality of first isolated holes separated from one another between the plurality of conductive lines in the first direction and the second direction by patterning the first insulation layer, forming a liner layer in the first isolated holes, in which the liner layer compensates for a vertical profile of the first isolated holes and has an etching selectivity with respect to the first insulation layer, filling a second insulation layer having an etching selectivity with respect to the first insulation layer, in the first isolated holes on the liner layer and forming a plurality of second isolated holes between the conductive lines by removing the first insulation layer using the etching selectivity between the second insulation layer and the first insulation layer.

In the forming of the plurality of first isolated holes, a curved portion may be formed in the first isolated holes. In the forming of the second insulation layer, the liner layer may be filled in the curved portion formed in the first isolated holes.

The forming of the plurality of first isolated holes may include: forming a mask layer on the first insulation layer, and forming a curved portion in the plurality of first isolated holes by etching the first insulation layer using the mask layer as an etching mask.

The forming of the liner layer and the second insulation layer may include: forming the liner layer on the curved portion, an inner side wall and a bottom of the first isolated holes, etching the liner layer to form a patterned liner layer filling in the curved portion and forming an insulation material on the patterned liner layer to fill the first isolated holes. The method may further include, after forming the first isolated holes, recessing the mask layer by etching the mask layer outside the first isolated holes.

The first insulation layer may include an oxide layer, and the second insulation layer may include a nitride layer.

A separation distance between the second isolated holes in the first direction may be determined according to a width of the conductive lines, and a separation distance between the second isolated holes in the second direction may be determined according to a width of the second insulation layer.

The second insulation layer may have an etching selectivity with respect to the liner layer, and the liner layer may be removed by using the etching selectivity between the liner layer and the second insulation layer after removing the first insulation layer.

The method may further include forming a contact plug filling in the second isolated holes after forming the second isolated holes.

According to an exemplary embodiment of the inventive concept, there is provided a method of manufacturing a semiconductor device. The method includes forming a plurality of active regions that are separated from one another, on a substrate, forming a plurality of word lines across the plurality of active regions in a first direction and a separated from one another in a second direction perpendicular to the first direction, forming a plurality of first contact plugs on the active regions, in which the first contact plugs are insulated from an interlayer insulation layer, forming a plurality of bit lines electrically connected to the first contact plugs and across the word lines and a slender hole between the bit lines, forming a first insulation layer filling the slender hole between the bit lines, forming a plurality of first isolated holes that are separated from one another between the bit lines in the first direction and the second direction, by patterning the second insulation layer, forming a liner layer in the first isolated holes, in which the liner layer compensates for a vertical profile of the first isolated holes and has an etching selectivity with respect to the first insulation layer, and filling a second insulation layer in the first isolated holes on the liner layer. The second insulation layer has an etching selectivity with respect to the first insulation layer. The method further includes forming a plurality of second isolated holes between the bit lines by removing the first insulation layer using the etching selectivity between the second insulation layer and the first insulation layer, and forming a second contact plug filling in the second isolated holes.

The plurality of word lines may be filled in a word line trench that is formed by etching the active regions and are formed on the active regions.

The first contact plugs may be formed at a level higher than the word lines.

The forming of the first isolated holes may includes: forming a mask layer on the first insulation layer and forming a curved portion in the first isolated holes by etching the first insulation layer using the mask layer as an etching mask. The forming of the liner layer and the second insulation layer includes forming the liner layer on the curved portion, an inner side wall and a bottom of the first isolated holes, etching the liner layer to form a patterned liner layer filling in the curved portion, and forming an insulation material on the patterned liner layer thereby filling the first isolated holes.

The method may further include, after forming the first isolated holes, recessing the mask layer outside the first isolated holes by etching the mask layer.

In accordance with an exemplary embodiment of the inventive concept, a method of manufacturing a semiconductor device is provided. The method includes forming a device isolation trench having a plurality of device isolation regions therein in a substrate, thereby defining a plurality of active regions via the device isolation regions, forming a plurality of word line trenches in the substrate which extend parallel to one another and cross the active regions, sequentially forming a gate dielectric layer, a word line and a buried insulating layer in the word line trenches, in which the word lines are disposed across the active regions in a first direction and are separated from one another in a second direction perpendicular to the first direction, forming a first interlayer insulation layer on the buried insulating layer, forming a second interlayer insulation layer on the first interlayer insulation layer, forming a plurality of direct contacts in the first and second interlayer insulation layers which are electrically connected to a source region of the active regions, and forming a plurality of bit line stack structures which extend parallel to one another above the first and second interlayer insulation layers and the plurality of direct contacts, in which the bit line stack structures include a plurality of bit lines disposed across the word lines and electrically connected to the direct contacts and a plurality of insulation capping lines that cover an upper surface of the bit lines, wherein the insulation capping lines are thicker than the bit lines.

The method further includes forming a plurality of slender holes between the bit lines of adjacent bit line stack structures, forming an insulation liner which covers exposed upper surfaces and exposed sidewalls of the bit line stack structures and an exposed upper surface of the second interlayer insulation layer, forming a plurality of spacers covering the insulation liner on opposing sidewalls of the bit line stack structures, and forming a first insulation layer filling the slender holes between the adjacent bit line stack structures.

In addition, the method further includes forming a mask pattern on the bit line stack structures, the first insulation layer and the insulation liner, thereby exposing a portion of the first insulation layer via the mask pattern, etching the exposed portion of the first insulation layer using the mask pattern as an etching mask to form a plurality of patterned first insulation layers and a plurality of first isolated holes between the patterned first insulation layers and between the bit line stack structures, in which the first isolated holes are separated from each other in the first and second directions by the patterned first insulation layers and the bit line stack structures, etching an exposed portion of the insulation liner using the mask pattern as an etching mask to form a patterned insulation liner, removing the mask pattern, forming a plurality of second insulation layers filling the first isolated holes after removing the mask pattern, in which the second insulation layers have an etch selectivity with respect to the patterned first insulation layers, removing the patterned first insulation layers by using the etch selectivity between the second insulation layers and the patterned first insulation layers, thereby forming a plurality of second isolated holes between the bit line stack structures and between the second insulation layers, in which the second isolated holes are separated from each other via the second insulation layers and the bit line stack structures and forming a plurality of second contact plugs filling the second isolated holes.

BRIEF DESCRIPTION OF THE DRAWINGS

Exemplary embodiments of the inventive concept can be more clearly understood from the following detailed description taken in conjunction with the accompanying drawings in which.

DETAILED DESCRIPTION OF EXEMPLARY EMBODIMENTS

Figure 1:
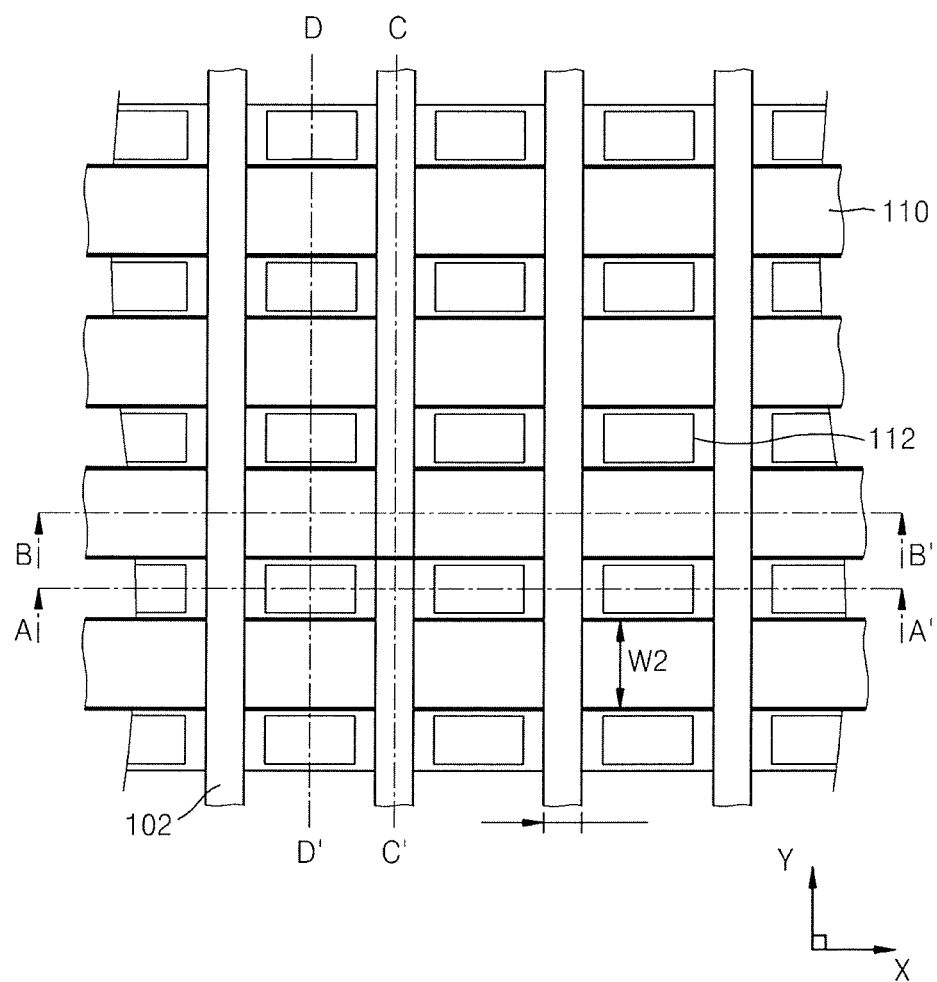
FIG. 1 is a schematic layout diagram for explaining a method of manufacturing a semiconductor device, according to an embodiment of the inventive concept.

Exemplary embodiments of the inventive concept will now be described more fully with reference to the accompanying drawings, in which exemplary embodiments of the invention are shown. Exemplary embodiments of the invention may, however, be embodied in many different forms and should not be construed as being limited to embodiments set forth herein.

The terminology used herein is for the purpose of describing particular embodiments only and is not intended to be limiting of exemplary embodiments of the invention. As used herein, the term "and/or" includes any and all combinations of one or more of the associated listed items. In addition, as used herein, the singular forms "a", "an" and "the" are intended to include the plural forms as well, unless the context clearly indicates otherwise.

In the drawings, like reference numerals denote like elements, and repeated descriptions will be omitted. Also, in the drawings, the size and relative sizes of layers and regions may be exaggerated for clarity.

FIG. 1 is a schematic layout diagram for explaining a method of manufacturing a semiconductor device, according to an embodiment of the inventive concept. FIGS. 2A through 2E are perspective views illustrating a method of manufacturing a semiconductor device as illustrated in FIG. 1 according to an order of processes, according to an embodiment of the inventive concept.

In FIGS. 1 and 2A through 2E, lines A-A', B-B', C-C', and D-D' respectively indicate the same directions in the drawings. According to the current embodiment of the inventive concept, as illustrated in FIG. 1, a plurality of conductive lines 102 and a plurality of second isolated holes 112 are, for example, insulated from each other via an insulator. However, for convenience of description, the conductive lines 102 and the second isolated holes 112 are illustrated as not insulated from each other in FIGS. 2A through 2E.

Figure 2A:
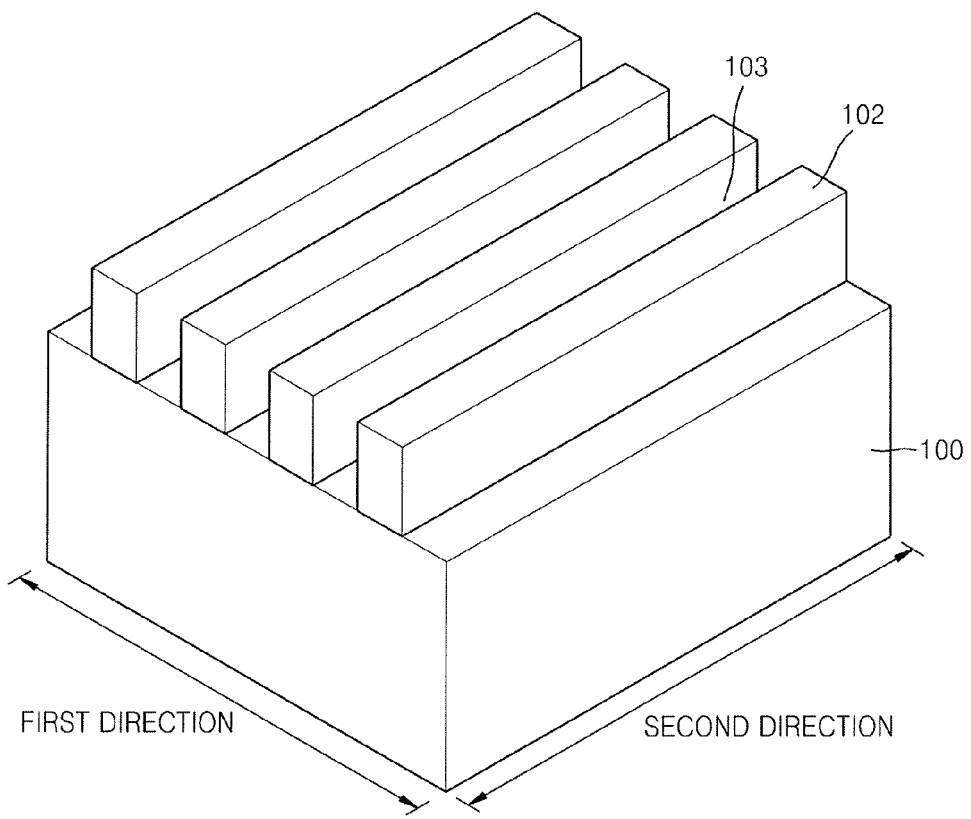
FIGS. 2A through 2E are perspective views illustrating a method of manufacturing a semiconductor device as illustrated in FIG. 1 according to an order of processes, according to an embodiment of the inventive concept.

Referring to FIGS. 1 and 2A, the method of manufacturing a semiconductor device, according to the current embodiment of the inventive concept, includes, for example, forming a plurality of conductive lines 102 on a supporting portion 100. The supporting portion 100 may be, for example, a semiconductor substrate, such as a silicon substrate or an insulation layer. The conductive lines 102 may be, for example, separated from one another in a first direction (X-axis direction) and may extend in a second direction (Y-axis direction) that is perpendicular to the first direction. The conductive lines 102 may have, for example, a width W1 in the first direction.

As the conductive lines 102 are formed, a slender hole 103 may be formed, for example, between the conductive lines 102. For example, a width of the slender hole 103 may be relatively narrow in the first direction, and a width thereof in the second direction may be longer than the width thereof in the first direction. A depth of the slender hole 103 may be, for example, deep in an upward direction on the supporting portion 100.

Figure 2B:
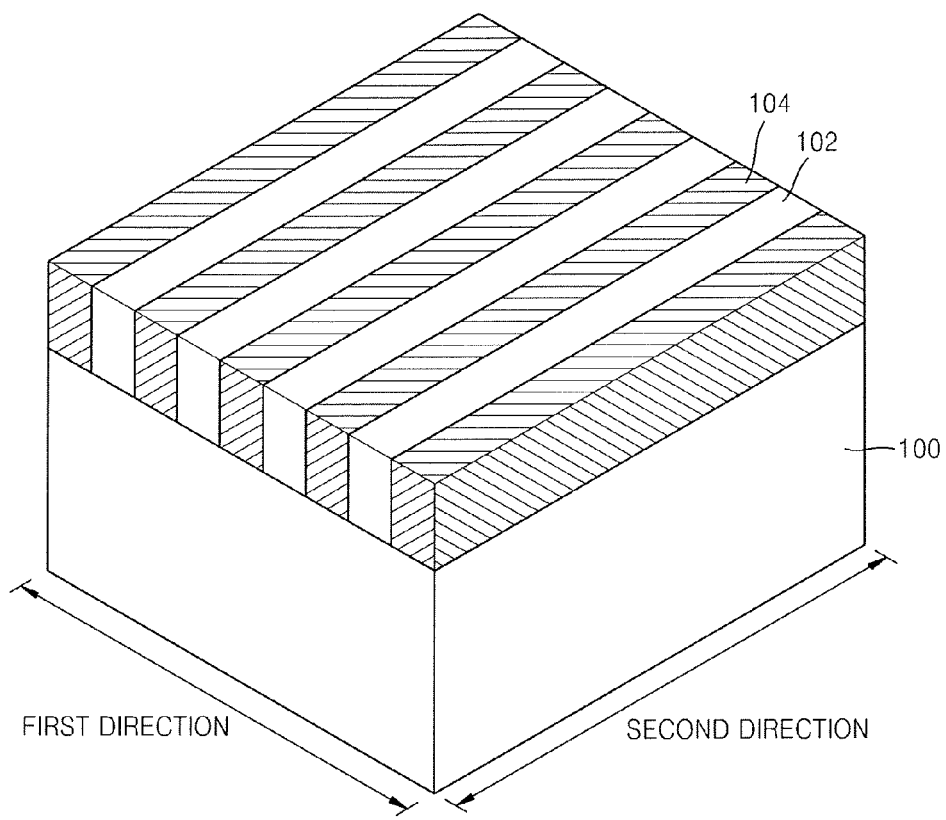

Referring to FIG. 2B, a first insulation layer 104 that fills the slender hole 103 between the conductive lines 102 is formed. The first insulation layer 104 may be formed by, for example, forming an insulation material that fills the slender hole 103 on the entire surface of the supporting portion 100, in which the slender hole 103 is formed, and then by etch-backing the insulation material. The first insulation layer 104 may be formed of, for example, an oxide layer, such as a silicon oxide layer.

Figure 2C:
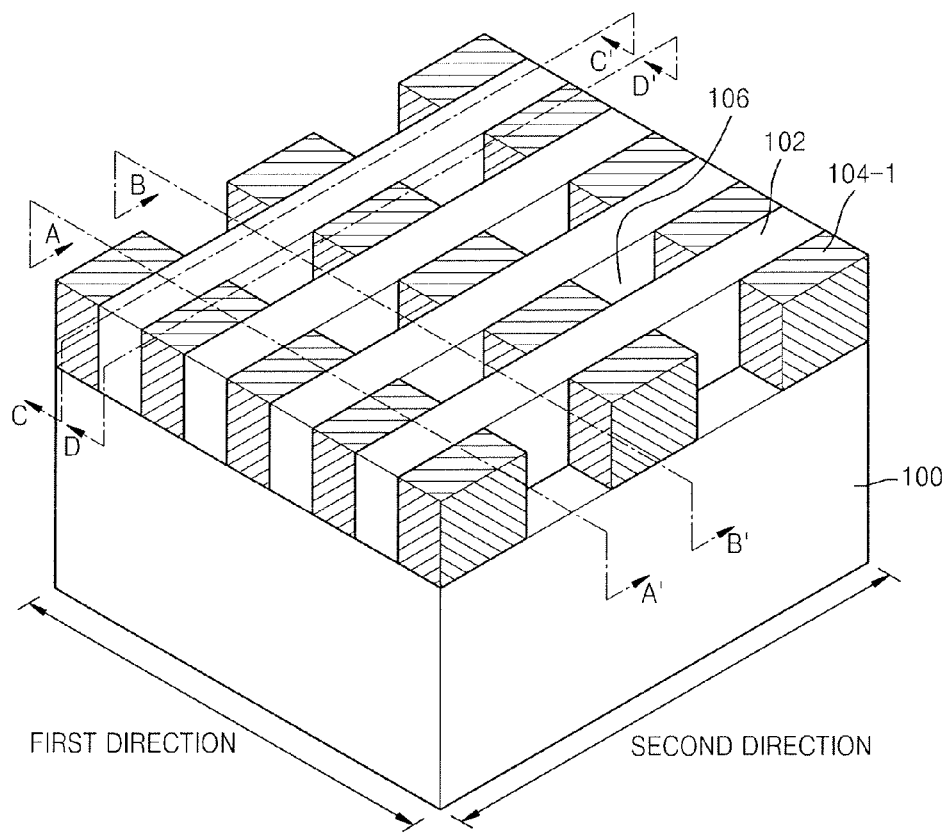

Referring to FIG. 2C, the first insulation layer 104 is patterned to form, for example, a plurality of first isolated holes 106 that are separated from one another in the first and second directions. Patterning of the first insulation layer 104 may be performed by, for example, using a photolithography operation. As the first isolated holes 106 are formed, the first insulation layer 104 is changed into a patterned first insulation layer 104-1. The first isolated holes 106 may refer to holes that are individually isolated from one another via the patterned first insulation layer 104-1 and the conductive lines 102.

Figure 2D:
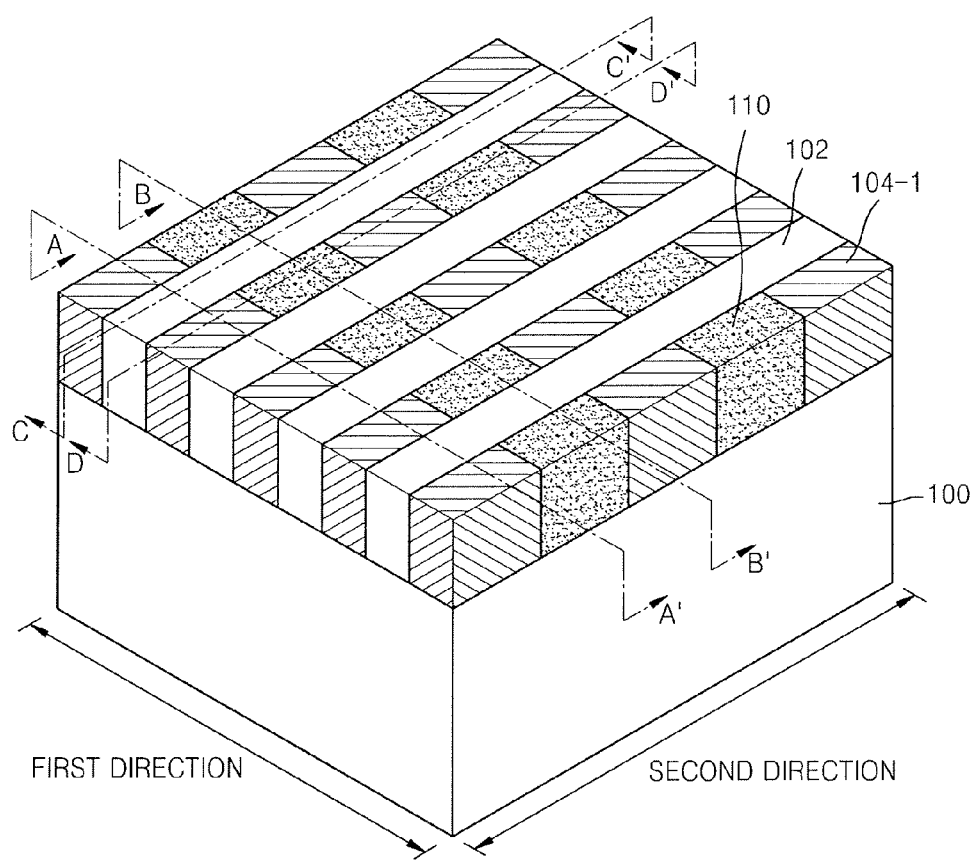

Referring to FIGS. 1 and 2D, a second insulation layer 110 having a predetermined etching selectivity with respect to the first insulation layer 104 is filled in the first isolated holes 106. The second insulation layer 110 may be formed by, for example, forming an insulation material that fills the first isolated holes 106 and then etch-backing the insulation material. The second insulation layer 110 may have, for example, a width W2 in the second direction. The second insulation layer 110 may be formed of, for example, a nitride, such as a silicon nitride layer.

In a highly integrated semiconductor device, the first isolated holes 106 may have a deep depth and a large aspect ratio. However, according to the current embodiment of the inventive concept, the first isolated holes 106 may be filled without creating voids in the second insulation layer 110. An operation of forming the first isolated holes 106 and the second insulation layer 110, as illustrated in FIGS. 2C and 2D, will be further described in detail later.

Figure 2E:
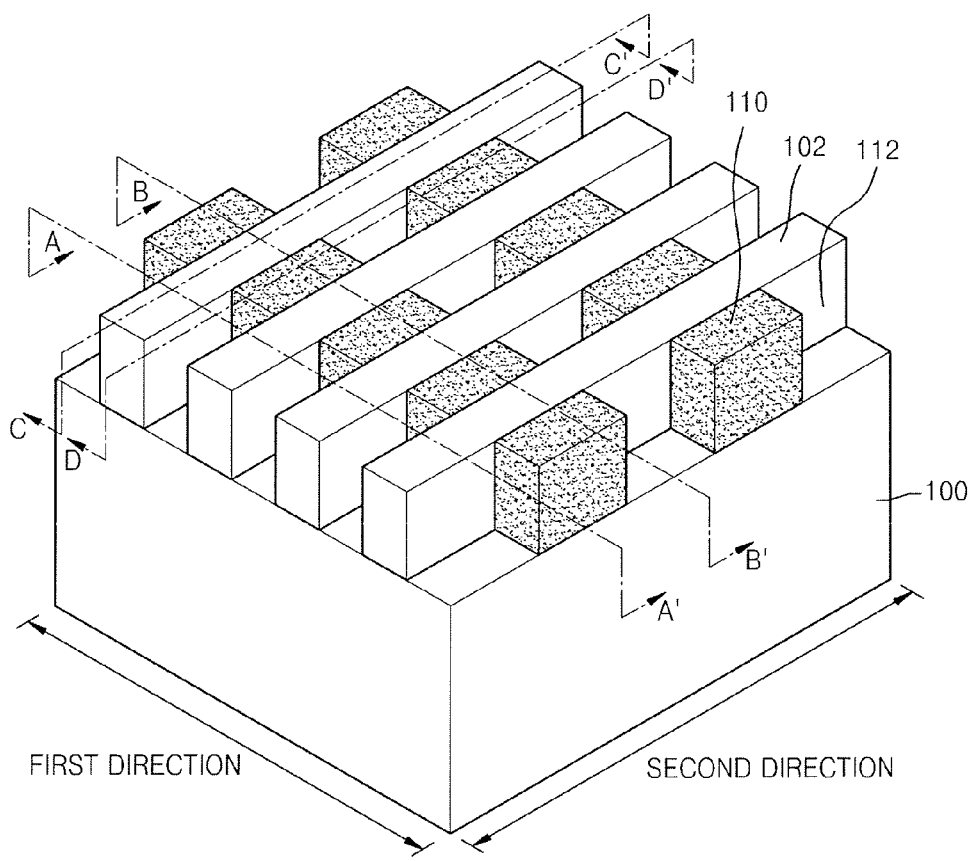

Referring to FIGS. 1 and 2E, the patterned first insulation layer 104-1 is removed by, for example, using the etching selectivity between the second insulation layer 110 and the first insulation layer 104. Accordingly, second isolated holes 112 are formed between the conductive lines 102. The second isolated holes 112 may be, for example, separated from one another in the first and second directions. The second isolated holes 112 may refer to holes that are individually isolated from one another via the second insulation layer 110 and the conductive lines 102. Separation distances between the second isolated holes 112 in the first direction are determined by the width W1 of the conductive lines 102, and separation distances between the second isolated holes 112 in the second direction may be determined by the width W2 of the second insulation layer 110. According to the manufacturing method of the current embodiment of the inventive concept, the second isolated holes 112 may be readily formed between the conductive lines 102 at desired positions.

FIGS. 3A through 3D are cross-sectional views illustrating an operation of filling the first isolated holes 106 and burying the second insulation layer 110 of FIGS. 2C and 2D, according to an embodiment of the inventive concept.

Figure 3A:
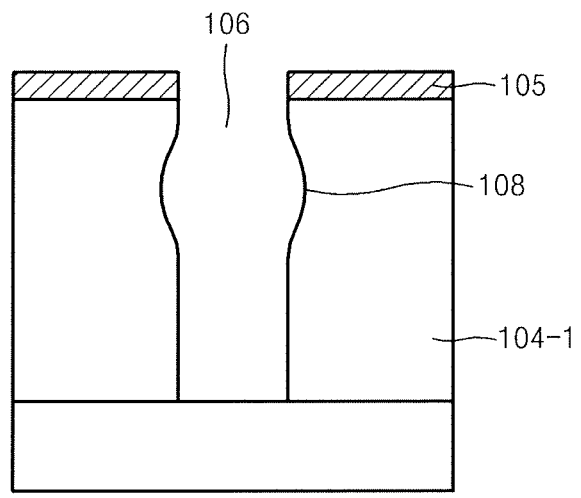
FIGS. 3A through 3D are cross-sectional views illustrating an operation of filling first isolated holes and burying a second insulation layer of FIGS. 2C and 2D, according to an embodiment of the inventive concept.

Referring to FIG. 3A, the first insulation layer 104 is etched by, for example, using a mask layer 105 to form the patterned first insulation layer 104-1 having the first isolated holes 106. When the first isolated holes 106 are formed, a curved portion 108 may be formed in the first isolated holes 106. The curved portion 108 may be, for example, a portion which is inwardly dented into an inner wall of the first isolated holes 106. Alternatively, unlike FIG. 3A, the curved portion 108 may be, for example, a portion protruded from an inner wall of the first isolated holes 106. As used herein, the curved portion 108 may refer to not uniform portions of an inner wall of the first isolated holes 106, which are inwardly dented into or protruded from the inner wall of the first isolated holes 106. The curved portion 108 may refer to, for example, bowing of the inner wall of the first isolated holes 106.

Figure 3B:
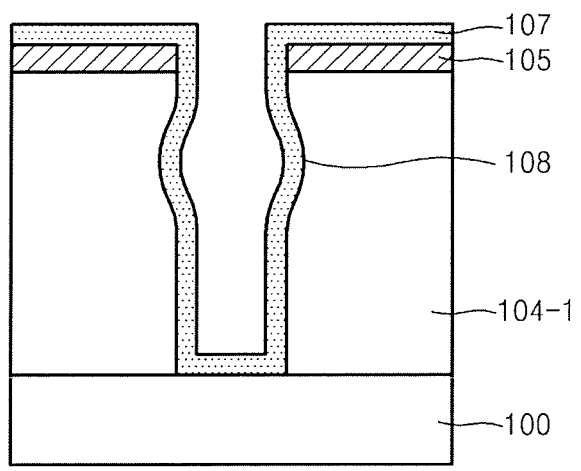

Referring to FIG. 3B, a liner layer 107 is formed on the mask layer 105 and the entire surface of the first isolated holes 106 in which the curved portion 108 is formed. The liner layer 107 is formed on, for example, the mask layer 105, on an inner portion of the curved portion 108, on the inner wall and a bottom of the first isolated holes 106. The liner layer 107 may be formed inside the first isolated holes 106, that is, on the inner wall of the first isolated holes 106, to compensate for a vertical profile of the first isolated holes 106. The liner layer 107 may have, for example, an etching selectivity with respect to the patterned first insulation layer 104-1. The liner layer 107 may be formed of, for example, a nitride layer, such as a silicon nitride layer.

Figure 3C:
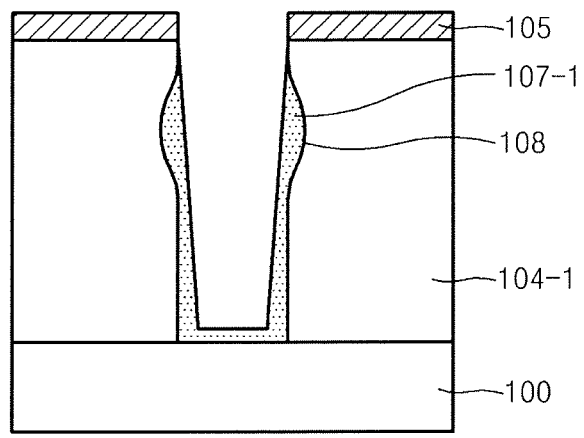
Figure 3D:
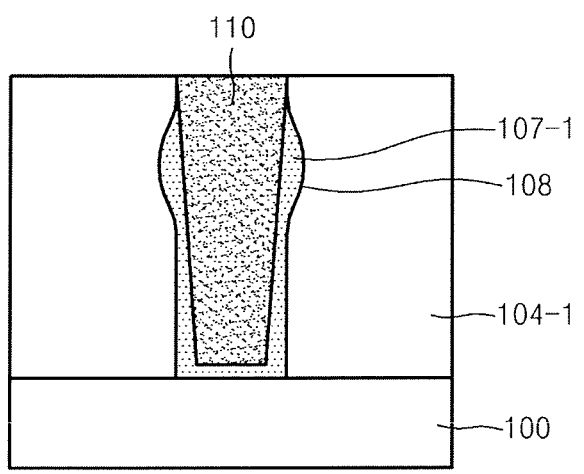

Referring to FIGS. 3C and 3D, the liner layer 107 is etched as illustrated in FIG. 3C (spacer etching) to form a patterned liner layer 107-1, for example, inside the curved portion 108 and on the inner wall and the bottom of the first isolated holes 106. In other words, the patterned liner layer 107-1 may be disposed on the inner wall and the bottom of the first isolated holes 106 and fill in the curved portion 108. While FIG. 3C illustrates the patterned liner layer 107-1 also formed on the bottom of the first isolated holes 106, the patterned liner layer 107-1 may alternatively, for example, not be formed on the bottom of the first isolated holes 106 by adjusting an etching operation.

Further, as illustrated in FIG. 3D, the second insulation layer 110 is formed by, for example, filling an insulation material in the first isolated holes 106 on the patterned liner layer 107-1. The second insulation layer 110 may have an etching selectivity with respect to, for example, the first insulation layer 104. The second insulation layer 110 may be formed of the same as or a different material from the liner layer 107-1. The second insulation layer 110 may be formed of, for example, a nitride layer, such as a silicon nitride layer. When the second insulation layer 110 is formed, due to the patterned liner layer 107-1 buried in the curved portion 108, no voids may be formed in the second insulation layer 110.

In a subsequent operation, as described above, the patterned first insulation layer 104-1 may be removed by, for example, using the etching selectivity between the second insulation layer 110 and the patterned first insulation layer 104-1, thereby forming the second isolated holes 112 between the conductive lines 102.

According to an embodiment of the inventive concept, the second insulation layer 110 may be formed of, for example, a material having an etching selectivity with respect to the patterned liner layer 107-1. In other words, the second insulation layer 110 and the patterned liner layer 107-1 may be formed of materials having, for example, different etching selectivities. Accordingly, after the patterned first insulation layer 104-1 is removed, the patterned liner layer 107-1 may be removed by using, for example, the etching selectivity between the patterned liner layer 107-1 and the second insulation layer 110. This allows the forming of a uniform vertical profile of an inner wall of the second isolated holes 112.

FIGS. 4A through 4D are cross-sectional views illustrating an operation of forming the first isolated holes 106 and burying the second insulation layer 110 of FIGS. 2C and 2D, according to an embodiment of the inventive concept.

For example, FIGS. 4A through 4D correspond to FIGS. 3A through 3D except for forming a mask layer 105-1 by recessing the mask layer 105.

The patterned insulation layer 104-1 having the first isolated holes 106 is formed, for example, by etching the first insulation layer 104 by using the mask layer 105 as illustrated in FIG. 3A. The curved portion 108 may be formed, for example, in the first isolated holes 106.

Figure 4A:
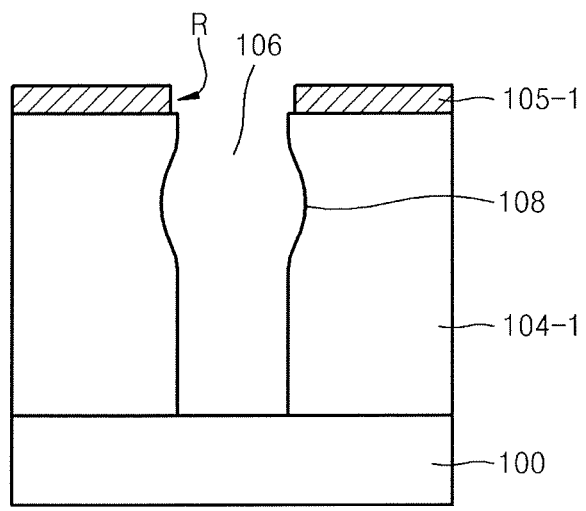
FIGS. 4A through 4D are cross-sectional views illustrating an operation of forming first isolated holes and burying a second insulation layer of FIGS. 2C and 2D, according to an embodiment of the inventive concept.

Referring to FIG. 4A, as denoted by a reference numeral R, the mask layer 105 may be etched to form the mask layer 105-1 that is recessed outside the first isolated holes 106. The mask layer 105 is recessed to readily form the patterned liner layer 107-2 on the curved portion 108 formed in the first isolated holes 106 in a subsequent operation.

Figure 4B:
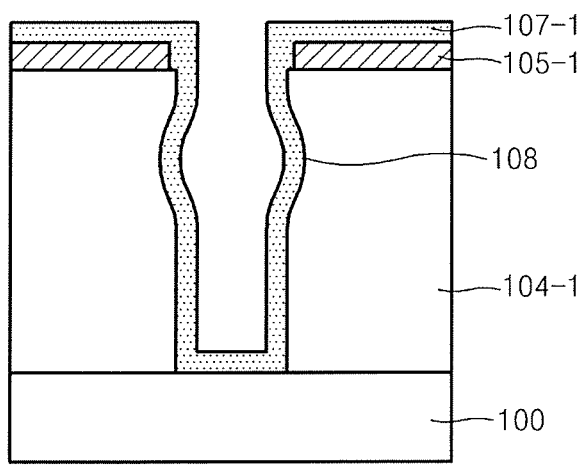

Referring to FIG. 4B, the liner layer 107-1 is formed on the recessed mask layer 105-1 and the entire surface of the first isolated holes 106 in which curved portion 108 is formed. The liner layer 107-1 is formed in a recessed portion R in the recessed mask layer 105-1, on the curved portion 108, and on an inner wall and a bottom of the first isolated holes 106. The liner layer 107-1 may be formed of, for example, a nitride layer, such as a silicon nitride layer. Description of the liner layer 107-1 that is common to the description provided above with reference to FIG. 3B will be omitted.

Figure 4C:
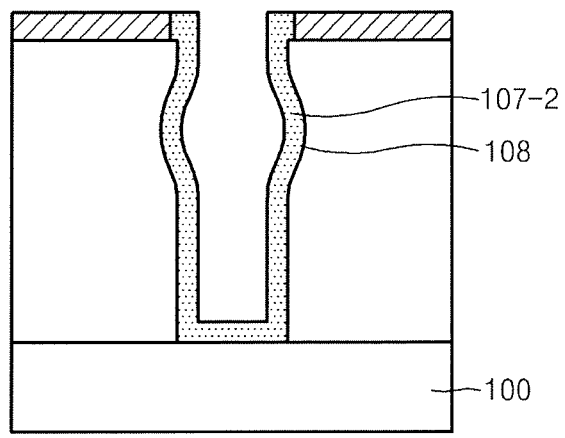
Figure 4D:
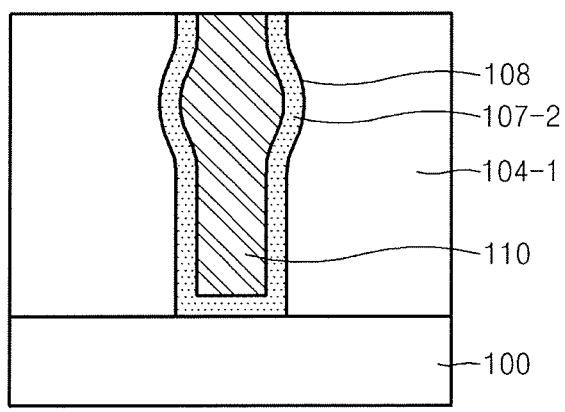

Referring to FIGS. 4C and 4D, the liner layer 107-1 is etched as illustrated in FIG. 4C to form a patterned liner layer 107-2 on the curved portion 108 and on an inner wall and a bottom of the first isolated holes 106. In other words, the patterned liner layer 107-2 may be disposed on the inner wall and the bottom of the first isolated holes 106 and fill in the curved portion 108. Description of the patterned liner layer 107-2 that is common to the description provided above with reference to FIG. 3C will be omitted.

Further, as illustrated in FIG. 4D, an insulation material is filled in the first isolated holes 106 on the patterned liner layer 107-2 to form the second insulation layer 110. The second insulation layer 110 may be formed of, for example, a nitride layer, such as a silicon nitride layer. When the second insulation layer 110 is formed, due to the patterned liner layer 107-2 filled in the curved portion 108, no voids may be formed in the second insulation layer 110.

Hereinafter, a method of manufacturing a semiconductor device, in which the operations as illustrated in FIGS. 1, 2A through 2E, 3A through 3D, and/or FIGS. 4A through 4D may be applied, will be described.

Figure 5:
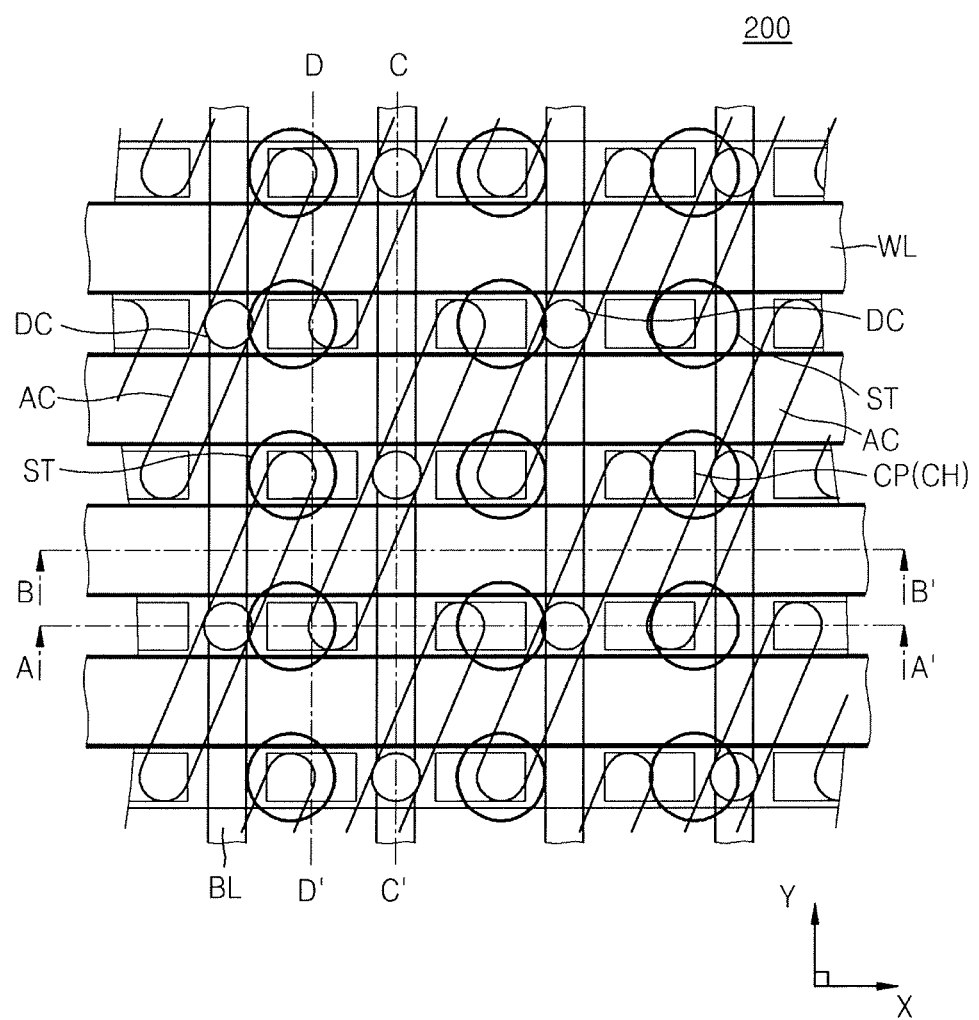
FIG. 5 is a schematic layout diagram illustrating a method of manufacturing a semiconductor device, according to an embodiment of the inventive concept.

FIG. 5 is a schematic layout diagram illustrating a method of manufacturing a semiconductor device 200, according to an embodiment of the inventive concept.

For example, the layout may be applied to a semiconductor memory device including a memory cell having a unit cell size of, for example, $6F^2$. Here, F denotes a minimum lithographic feature size.

The semiconductor device 200 includes, for example, a plurality of active regions AC. A plurality of word lines WL extend, for example, in parallel in a first direction (X-direction) across the active regions AC. The word lines WL may be disposed at, for example, equal distances in a second direction. A plurality of bit lines BL extend above the word lines WL, for example, in parallel in the second direction (Y-direction) that is orthogonal to the first direction.

The bit lines BL are connected to the active regions AC via, for example, a plurality of direct contacts DC. The direct contacts DC may be, for example, first contact plugs formed by filling a conductive material in a contact hole.

According to embodiments of the inventive concept, the bit lines BL may be, for example, arranged parallel to one another at a pitch of 3F. The word lines WL may be arranged, for example, parallel to one another at a pitch of 2F.

A plurality of second contact plugs CP are arranged, for example, in a series between every two adjacent bit lines BL from among the bit lines BL in the first direction and the second direction. According to embodiments of the inventive concept, the second contact plugs CP may be disposed at, for example, equal distances in the second direction. The second contact plugs CP may form buried contacts that are used to electrically connect a storage electrode ST of a capacitor to the active regions AC. The second contact plugs CP may be formed by, for example, filling a conductive material in a contact hole CH.

FIGS. 6 through 13 are cross-sectional views illustrating a main portion of the semiconductor device 200 of FIG. 5 according to an order of processes for explaining a method of manufacturing a semiconductor device, according to an embodiment of the inventive concept. In detail, cross-sectional views cut along lines A-A', B-B', C-C', and D-D' are illustrated in FIGS. 6 through 13.

Figure 6:
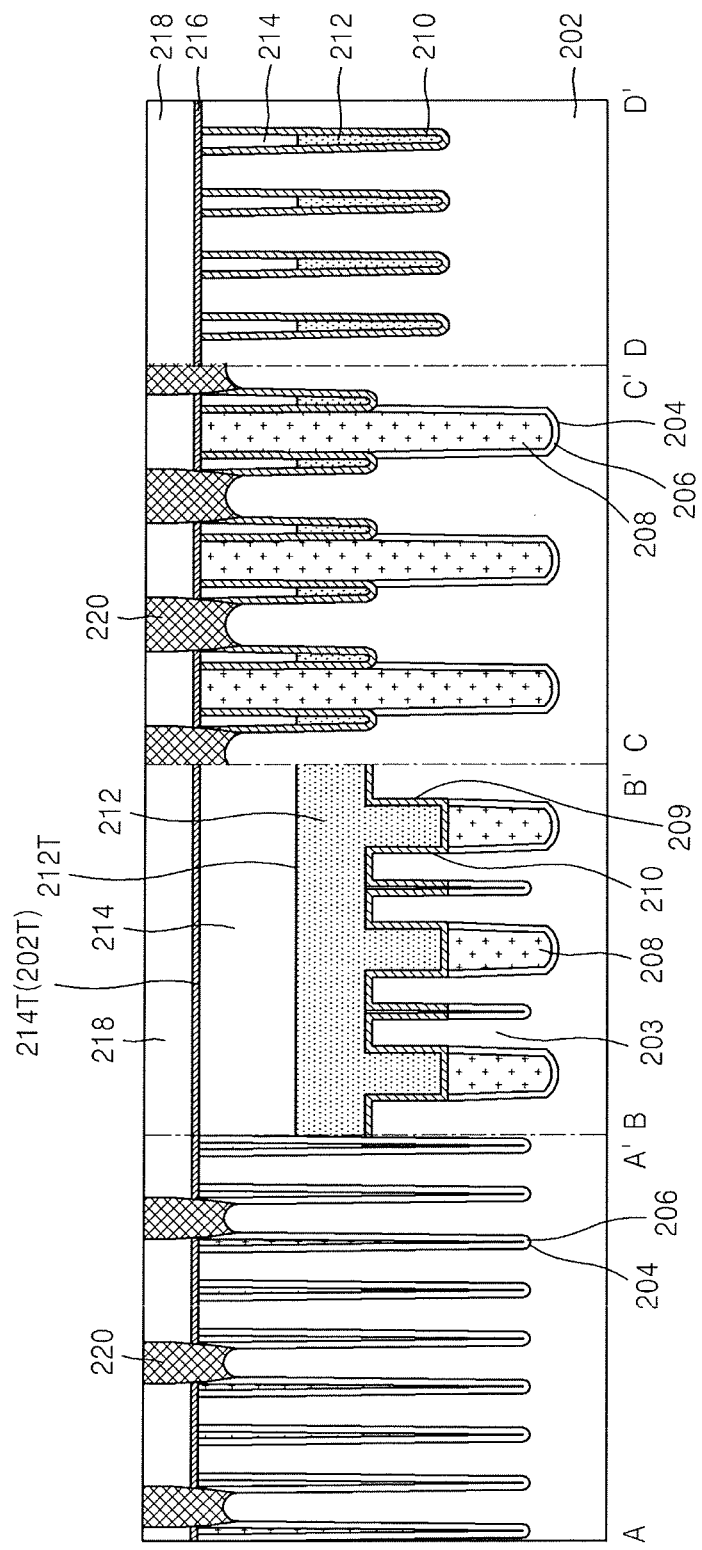
FIGS. 6 through 13 are cross-sectional views illustrating a main portion of the semiconductor device of FIG. 5 according to an order of processes for explaining a method of manufacturing a semiconductor device, according to an embodiment of the inventive concept.

Referring to FIG. 6, a device isolation trench 204 is formed in a substrate 202. Device isolation regions 206 and 208 are formed in the device isolation trench 204. Active regions AC 203 are defined in the substrate 202 via the device isolation regions 206 and 208. The active regions 203 may be in the form of, for example, relatively long islands having a short axis and a long axis.

The substrate 202 may include, for example, silicon (Si), such as crystalline Si, polycrystalline Si, or amorphous Si. According to embodiments of the inventive concept, the substrate 202 may include, for example, a compound semiconductor, such as germanium (Ge), or silicon germanium (SiGe), silicon carbide (SiC), gallium arsenide (GaAs), indium arsenide (InAs), or indium phosphide (InP). According to embodiments of the inventive concept, the substrate 202 may include, for example, a conductive region such as an impurity-doped well or an impurity-doped structure.

The device isolation regions 206 and 208 may include, for example, a first isolation insulation layer 206 and a second isolation insulation layer 208. The first isolation insulation layer 206 and the second isolation insulation layer 208 may be formed of, for example, different materials. For example, the first isolation insulation layer 206 may be formed of an oxide layer, such as a silicon oxide layer, and the second isolation insulation layer 208 may be formed of a nitride layer, such as a silicon nitride layer. However, the device isolation regions 206 and 208 are not limited to the above-mentioned materials. For example, the device isolation regions 206 and 208 may be formed of a single layer formed of one type of insulation layer or a multi-layer formed of a combination of at least three types of insulation layers.

A plurality of word line trenches 209 are formed in the substrate 202. The word line trenches 209 extend, for example, parallel to one another and may be in the form of lines that cross the active regions 203.

As illustrated in the B-B' cross-section of FIG. 6, to form the word line trenches 209 in which steps are formed in lower surfaces thereof, the device isolation regions 206 and 208 and the substrate 202 may be each etched using, for example, different etching processes so that an etching depth of the device isolation regions 206 and 208 and an etching depth of the substrate 202 are different.

For example, a plurality of gate dielectric layers 210, a plurality of word lines 212, and a buried insulation layer 214 are sequentially formed in the word line trenches 209.

According to embodiments of the inventive concept, after the word lines 212 are formed, a source/drain region (not shown) may be formed, for example, on an upper surface of the active region 203 by implanting impurity ions in the substrate 202 on both sides of the word lines 212. Alternatively, in an embodiment of the inventive concept, an impurity-ion implanting operation for forming a source/drain region may instead be performed before forming the word lines 212.

Each upper surface 212T of the plurality of word lines 212 are disposed at, for example, a lower level than an upper surface 202T of the substrate 202. For example, a lower surface of the plurality of word lines 212 have a concave-convex structure, and a FIN-type field electric transistor (FET) is formed in the plurality of active regions 203.

In the FIN-type FET, the word lines 212 contact the active regions 203 having a concave-convex structure, and accordingly, the electrostatic capacitance of a drain may be significantly reduced and a channel resistance adjusting capability of a device due to a drain voltage may be lowered, thereby reducing short channel effects.

According to embodiments of the inventive concept, the plurality of word lines 212 may be formed of, for example, at least one material selected from the group consisting of titanium (Ti), titanium nitride (TiN), tantalum (Ta), tantalum nitride (TaN), tungsten (W), tungsten nitride (WN), titanium silicon nitride (TiSiN), and tungsten silicon nitride (WSiN).

The gate dielectric layer 210 may be formed of, for example, at least one material selected from the group consisting of a silicon oxide layer, a silicon nitride layer, a silicon oxynitride layer, an oxide/nitride/oxide (ONO), and a high-k dielectric film having a higher dielectric constant than a silicon oxide layer. For example, the gate dielectric layer 210 may have a dielectric constant of about 10 to about 25. According to embodiments of the inventive concept, the gate dielectric layer 210 may be formed of, for example, at least one material selected from the group consisting of hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric layer 210 may be formed of $HfO_2$, $Al_2O_3$, $HfAlO_3$, $Ta_2O_3$, or $TiO_2$.

Each upper surface 214T of the plurality of buried insulation layers 214 is disposed at, for example, approximately the same level as the upper surface 202T of the substrate 202. The buried insulation layers 214 may be formed of, for example, a silicon oxide layer, a silicon nitride layer, a silicon oxynitride layer, or a combination of these.

A first interlayer insulation layer 216 and a second interlayer insulation layer 218 are formed on the substrate 202. The first and second interlayer insulation layers 216 and 218 may have a thickness of, for example, about 200 Å to about 400 Å. The first interlayer insulation layer 216 may include, for example, an oxide layer. For example, the first interlayer insulation layer 216 may be formed of tetraethyl orthosilicate (TEOS), high density plasma (HDP), or boro-phospho silicate glass (BPSG). The second interlayer insulation layer 218 may include, for example, a polysilicon layer.

A plurality of direct contacts DC 220, which may be electrically connected to a source region of the active region 203, are formed in the first and second interlayer insulation layers 216 and 218. The direct contacts DC 220 may be, for example, first contact plugs which are formed by filling a conductive material in a contact hole (not shown) in the first and second interlayer insulation layers 216 and 218.

Figure 7:
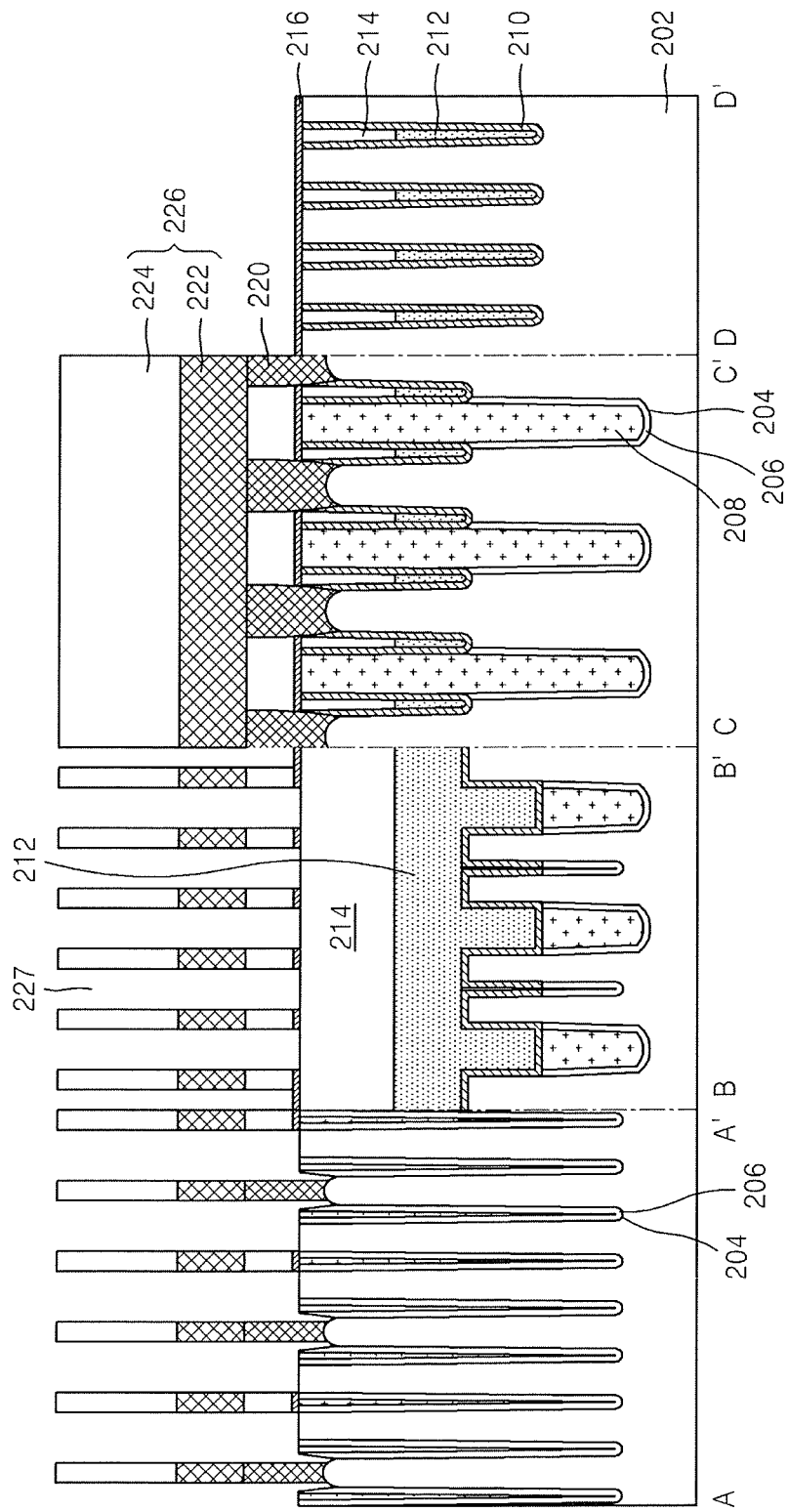

Referring to FIG. 7, a plurality of bit line stack structures 226 that extend, for example, parallel to one another above the first and second interlayer insulation layers 216 and 218 and the plurality of direct contacts DC 220 are formed. The plurality of bit line stack structures 226 may include, for example, a plurality of bit lines 222 and a plurality of insulation capping lines 224 that cover an upper surface of the bit lines 222. The plurality of bit lines 222 may be electrically connected to, for example, the plurality of direct contacts DC 220.

According to embodiments of the inventive concept, the plurality of bit lines 222 are formed of, for example, at least one material selected from the group consisting of an impurity-doped semiconductor, a metal, a metal nitride, and a metal silicide. For example, the plurality of bit lines 222 may have a stack structure in which a doped polysilicon, a tungsten nitride, and tungsten are sequentially stacked.

According to embodiments of the inventive concept, the plurality of insulation capping lines 224 are formed of, for example, a silicon nitride layer. The insulation capping lines 224 may be, for example, thicker than the bit lines 222.

For example, according to embodiments of the inventive concept, to form the bit line stack structures 226, first, a conductive layer for forming bit lines and a capping insulation layer that covers the conductive layer are formed on the first and second interlayer insulation layers 216 and 218. The capping insulation layer may be, for example, thicker than the conductive layer for forming bit lines. Then, the capping insulation layer is, for example, patterned to form a plurality of insulation capping lines 224, and the plurality of insulation capping lines 224 are used as an etching mask to etch the conductive layer for forming bit lines, thereby forming a plurality of bit lines 222.

According to embodiments of the inventive concept, as illustrated in FIG. 7 showing A-A' and B-B' cross-sections, when the conductive layer for forming bit lines is etched, the first and second interlayer insulation layers 216 and 218, and direct contacts DC 220 may be etched and patterned by excessive etching.

According to embodiments of the inventive concept, the conductive layer for forming bit lines may be, for example, a multi-layer. For example, the conductive layer for forming bit lines may have a multi-layer structure in which a first metal silicide layer, a conductive barrier layer, a second metal silicide layer, and an electrode layer formed of a metal or a metal nitride are sequentially stacked.

A slender hole 227 may be, for example, between two of the plurality of bit lines stack structures 226. That is, a slender hole 227 is formed between, for example, the bit lines 222. The slender hole 227 may be in the form of, for example, a line and have a relatively narrow width in the first direction and a relatively large width in the second direction.

Figure 8:
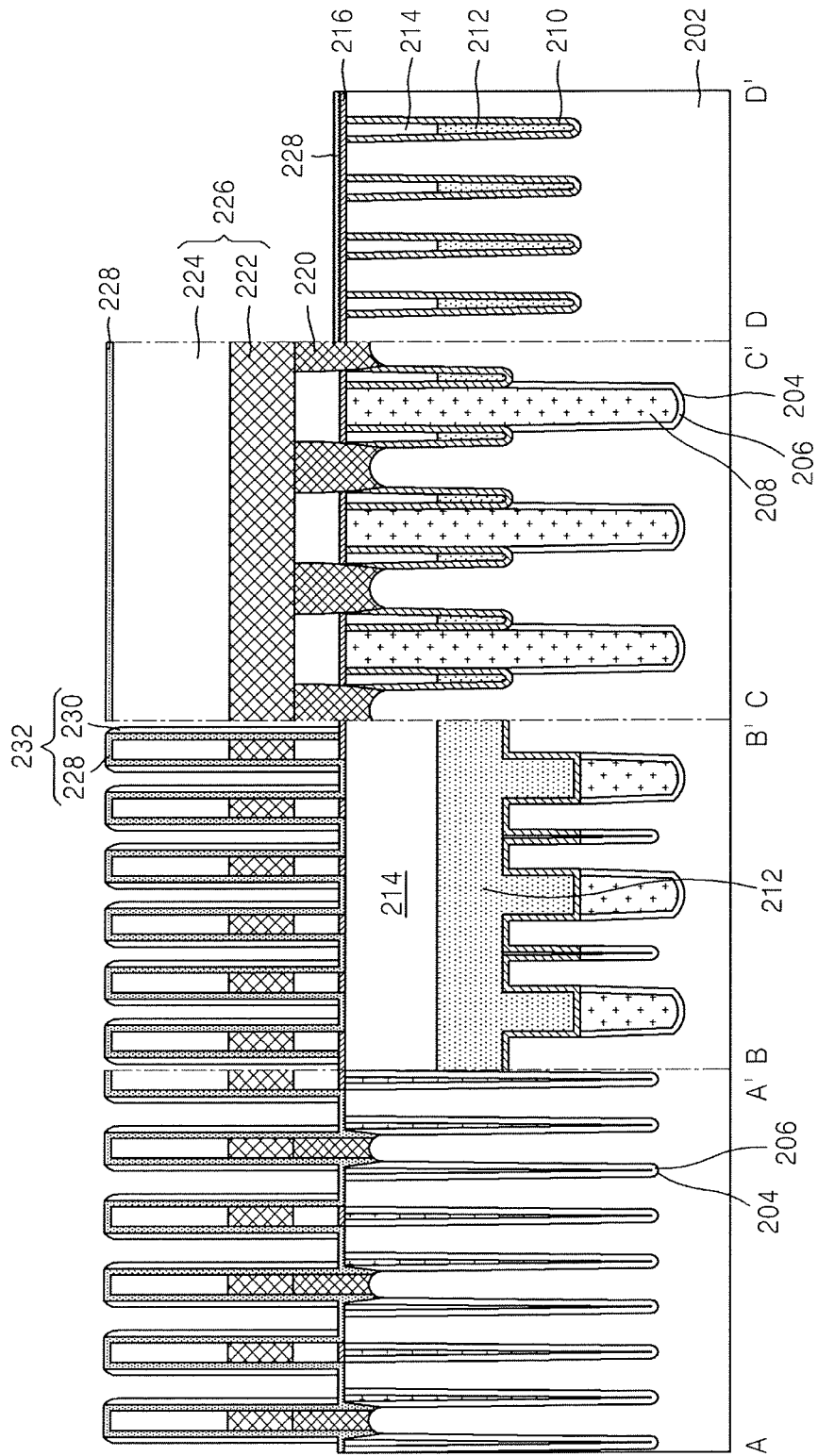

Referring to FIG. 8, an insulation liner 228 that covers exposed upper surfaces and exposed sidewalls of the bit line stack structures 226 and an exposed surface of the second interlayer insulation layer 218 is formed. According to embodiments of the inventive concept, the insulation liner 228 may be used as, for example, an etching stopping layer in subsequent operations. The insulation liner 228 may be used as, for example, a protection layer that protects the plurality of bit line stack structures 226. According to embodiments of the inventive concept, the insulation liner 228 is formed of, for example, a silicon nitride layer. The insulation liner 228 may have a thickness of, for example, about 30 Å to about 80 Å.

Further, after depositing an insulation layer on a resultant product on which the insulation liner 228 is formed, an insulation layer is, for example, etch-backed by using the insulation liner 228 as an etching stopping layer, thereby forming a plurality of spacers 230 that cover the insulation liner 228 on two sidewalls of the plurality of bit line stack structures 226. According to embodiments of the inventive concept, the plurality of spacers 230 are formed of, for example, silicon oxide, a silicon germanium (SiGe) compound, or a polymer. However, embodiments of the inventive concept are not limited to the above-mentioned materials for the plurality of spacers 230. The plurality of spacers 230 may be formed of, for example, a material having an etching selectivity with respect to the insulation liner 228. For example, the plurality of spacers 230 may be formed of an insulation material or a conductive material.

According to embodiments of the inventive concept, a second insulation liner (not shown) that, for example, covers the insulation liner 228 and the spacers 230 on the two sidewalls of the plurality of bit line stack structures 226 may be further formed. Consequently, a protection layer 232 formed of the insulation liner 228 and the spacers 230 may be formed on the two sidewalls of the bit line stack structure 226 to protect the bit line stack structures 226.

Figure 9:
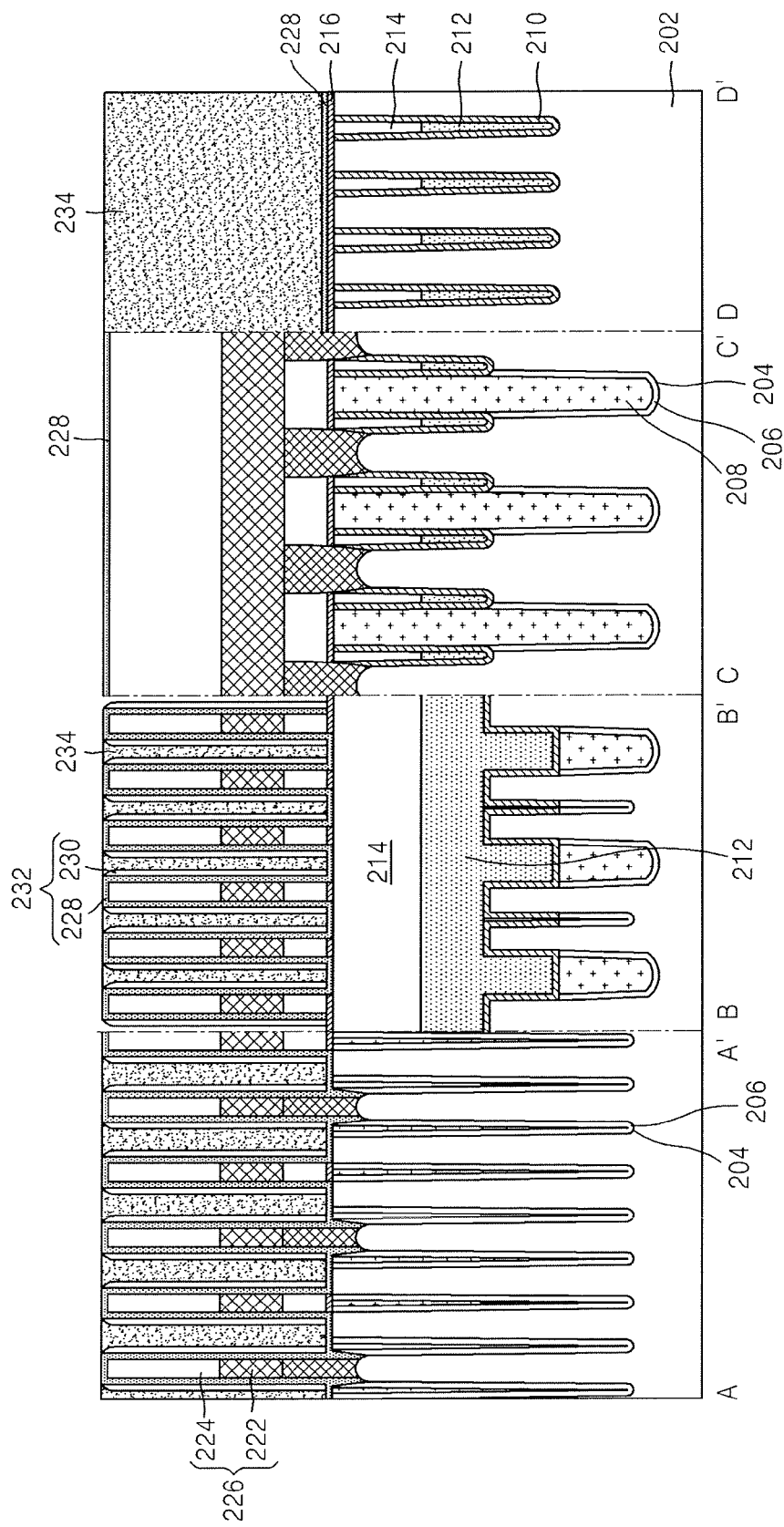

Referring to FIG. 9, a first insulation layer 234 is formed, for example, to fill the slender hole 227 formed between every two of the plurality of bit line stack structures 226. Referring to the D-D' cross-section of FIG. 9, the first insulation layer 234 is formed on the insulation liner 228.

According to embodiments of the inventive concept, to form the first insulation layer 234, an insulation material layer is, for example, filled in slender hole 227 between the bit lines stack structures 226, and then an etchback operation or a chemical mechanical polishing (CMP) operation may be used to etchback the insulation material layer until an upper surface of the plurality of insulation capping lines 224 is exposed. The first insulation layer 234 may be formed of, for example, an oxide layer, such as a silicon oxide layer. The operation of forming the first insulation layer 104 as illustrated in FIG. 2B above may also be the one used to form the first insulation layer 234.

Figure 10:
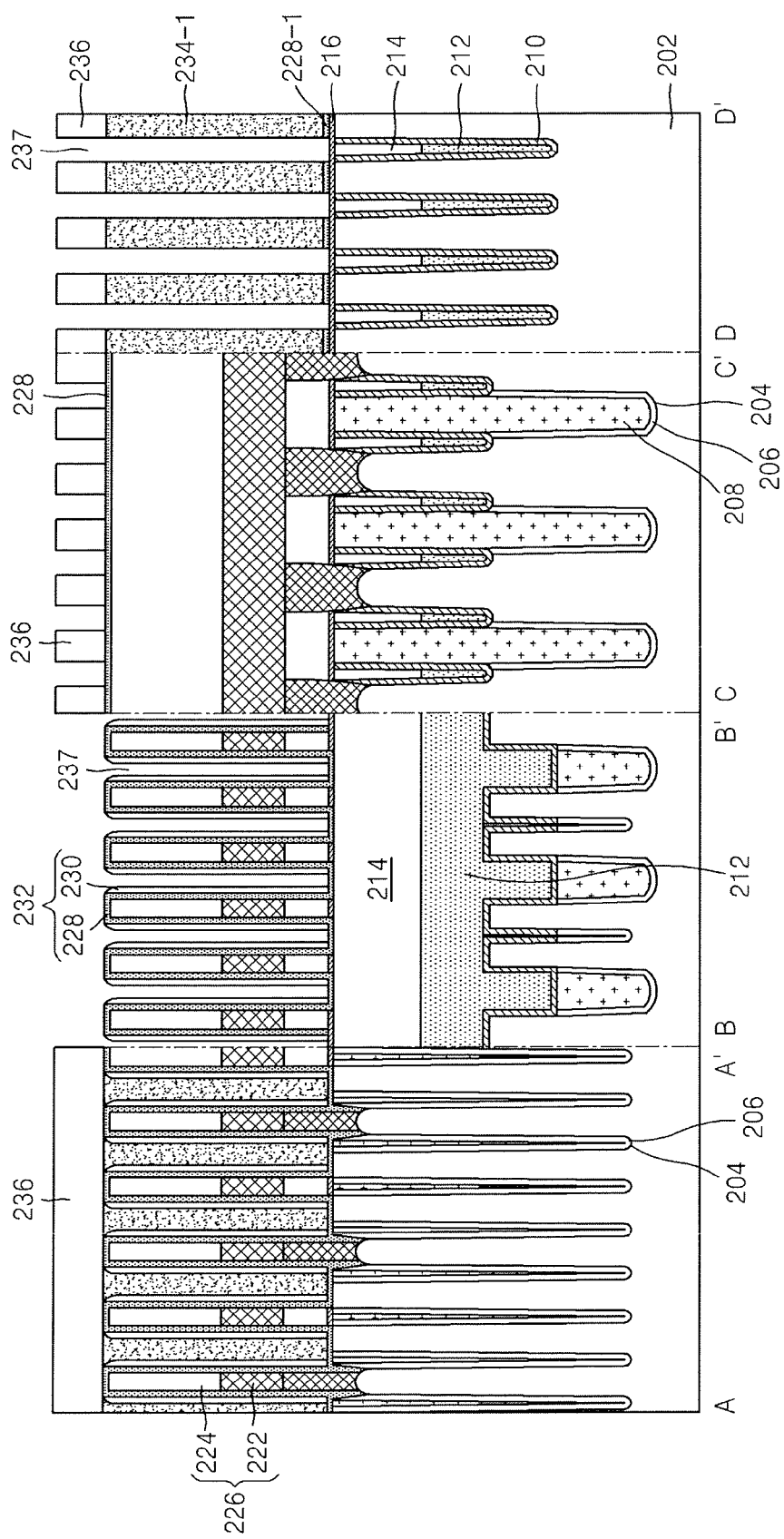

Referring to FIG. 10, a mask pattern 236 is formed on, for example, the bit line stack structures 226, the first insulation layer 234, and the insulation liner 228. A portion of the first insulation layer 234 on the B-B' and D-D' cross-sections illustrated in FIG. 10 may be exposed via the mask pattern 236. A patterned first insulation layer 234-1 is formed by, for example, etching the first insulation layer 234 by using the mask pattern 236 as an etching mask. A plurality of first isolated holes 237 may be formed, for example, between the patterned first insulation layers 234-1. Reference numeral 228-1 is a patterned insulation liner. The same manufacturing operation of the first isolated holes 106 as illustrated in FIG. 2C may be the one used to form the first isolated holes 237.

Figure 11:
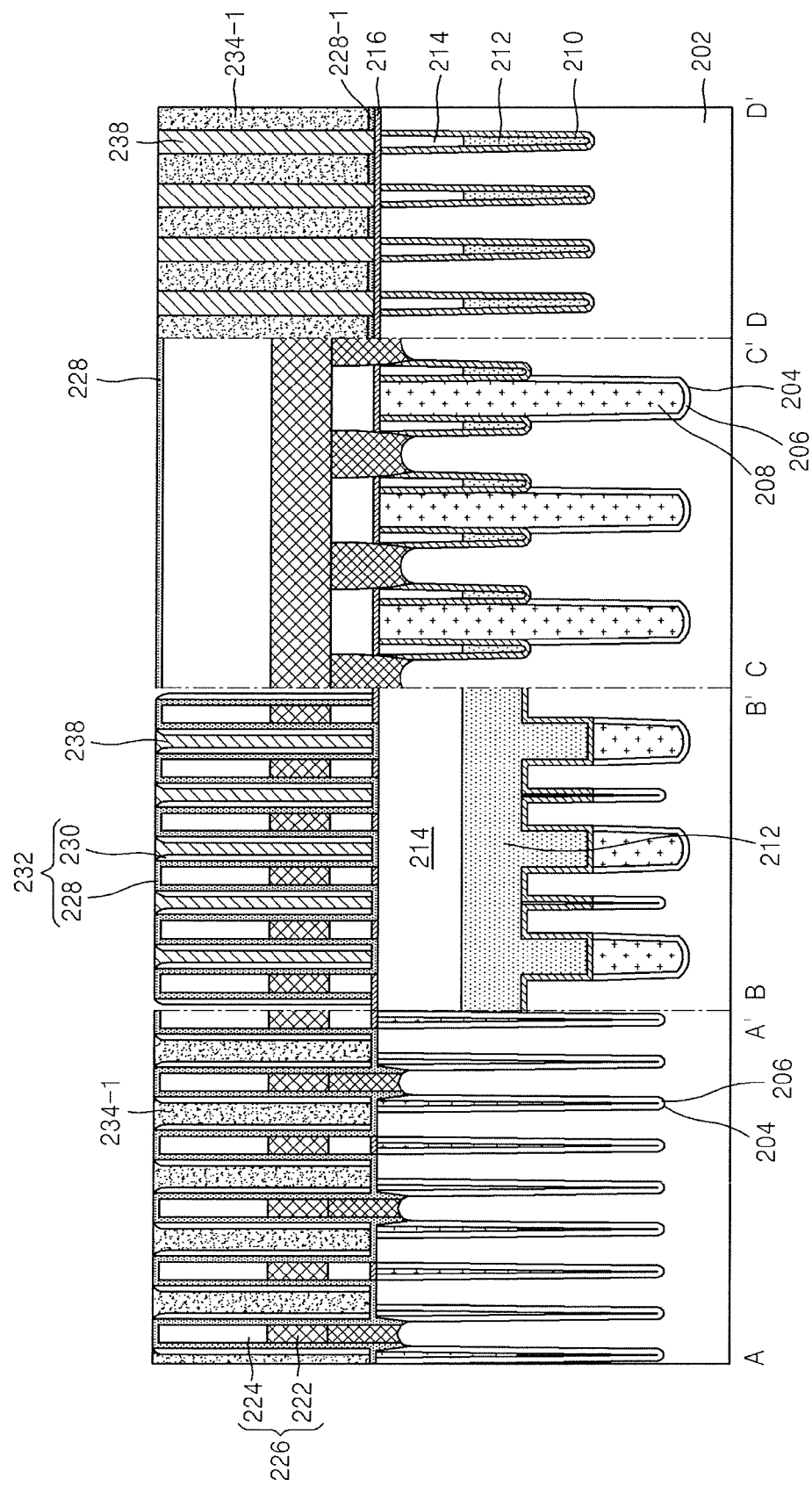

Referring to FIG. 11, after removing the mask pattern 236, as illustrated in cross-sectional views cut along a line B-B' and D-D', a second insulation layer 238 having, for example, an etching selectivity with respect to the patterned first insulation layer 234-1 is filled in the first isolated holes 237. The second insulation layer 238 may be formed by, for example, forming an insulation material to fill the first isolated holes 237 and then etch-backing the insulation material. The second insulation layer 238 may be formed of, for example, a nitride layer, such as a silicon nitride layer.

In a highly integrated semiconductor device, the first isolated holes 237 may have a deep depth and a large aspect ratio. However, according to the current embodiment of the inventive concept, the first isolated holes 237 may be formed without forming voids in the second insulation layer 238. The first isolated holes 237 and the second insulation layer 238 may be formed in the same manner as the operations illustrated in FIGS. 2C through 2D, 3A through 3D, and 4A through 4D.

Figure 12:
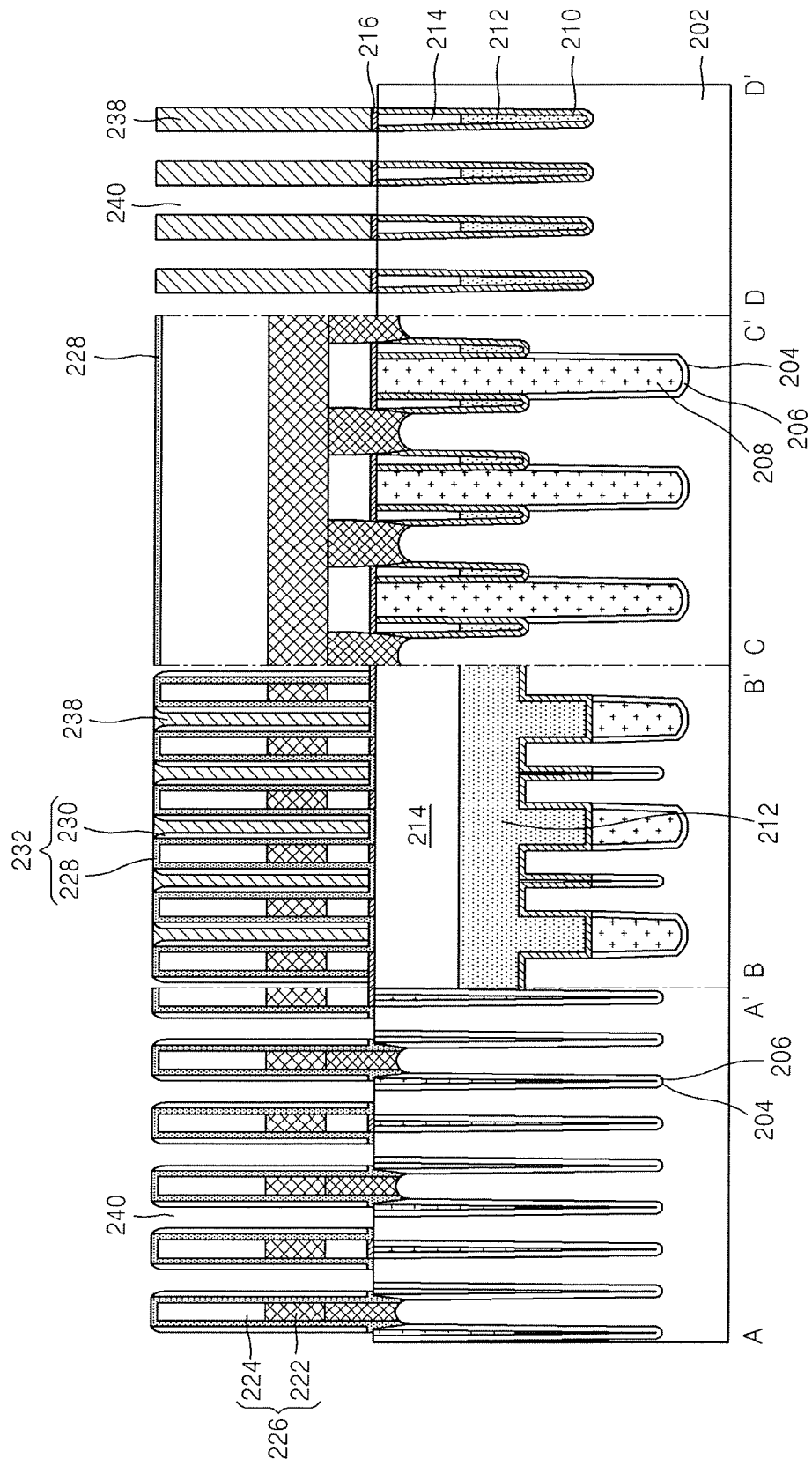

Referring to FIG. 12, the patterned first insulation layer 234-1 is removed by, for example, using the etching selectivity between the second insulation layer 238 and the patterned first insulation layer 234-1. Accordingly, a plurality of second isolated holes 240 are formed between the bit line stack structures 226. The second isolated holes 240 may be, for example, separated from one another by the bit line stack structures 226 in the first direction and the second direction. The second isolated holes 240 may refer to holes that are individually separated from one another via the second insulation layer 238 and the bit line stack structures 226. According to the above-described manufacturing operation, the second isolated holes 240 may be readily formed between the bit line stack structures 226 at desired positions. The second isolated holes 240 may be formed in the same manner as the operations illustrated in FIG. 2E.

Figure 13:
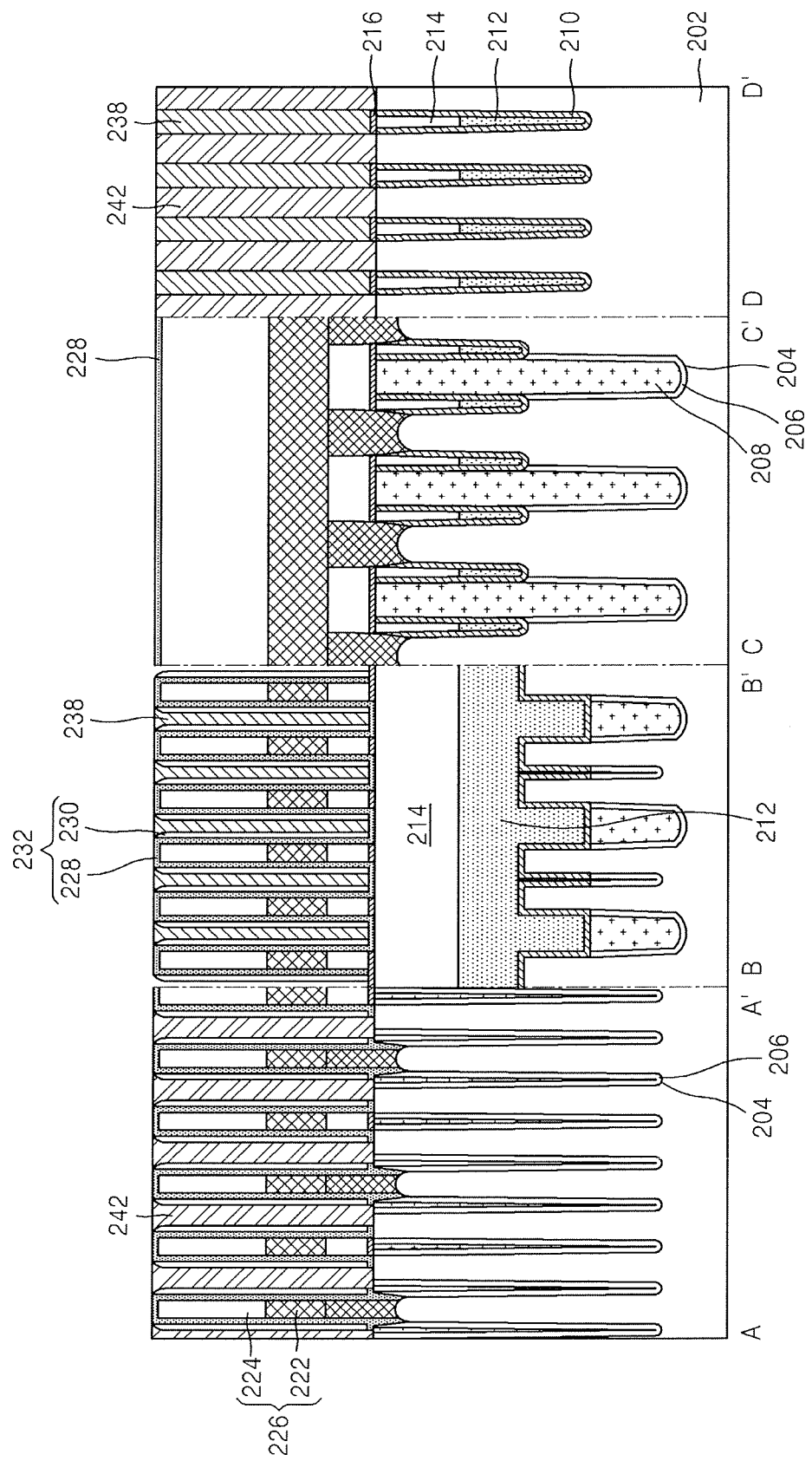

Referring to FIG. 13, a plurality of second contact plugs 242 are formed by, for example, filling a conductive material in the second isolated holes 240. The second contact plugs 242 may be, for example, buried contacts that are used to electrically connect the storage electrode ST (see FIG. 5) of a capacitor to the active regions AC (see FIG. 5). The second contact plugs 242 may be formed by, for example, filling a conductive material in the contact hole CH (see FIG. 5).

Figure 14:
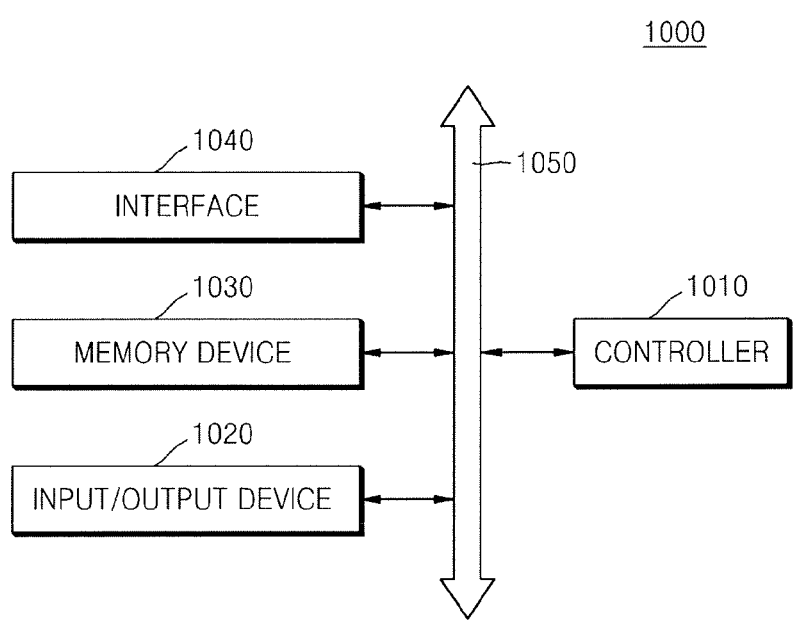
FIG. 14 is a block diagram illustrating a system including a semiconductor device manufactured according to a method of manufacturing a semiconductor device, according to an embodiment of the inventive concept.

FIG. 14 is a block diagram illustrating a system 1000 including a semiconductor device manufactured according to a method of manufacturing a semiconductor device, according to an embodiment of the inventive concept.

For example, the system 1000 may include a controller 1010, an input/output device 1020, a memory device 1030, and an interface 1040. The system 1000 may be, for example, a mobile system or a system that transmits or receives information. According to embodiments of the inventive concept, the mobile system may be, for example, a personal digital assistant (PDA), a portable computer, a web tablet, a wireless phone, a mobile phone, a digital music player, or a memory card. The controller 1010 is included to control an execution program in the system 1000, and may be formed of, for example, a microprocessor, a digital signal processor, a microcontroller, or other similar devices thereto. The input/ output device 1020 may be used to input or output data of the system 1000. The system 1000 may be connected to an external device such as, for example, a personal computer or a network via the input/output device 1020, and may exchange data with the external device. The input/output device 1020 may be, for example, a keypad, a keyboard, or a display.

The memory device 1030 may store a code and/or data for an operation of the controller 1010 or may store data processed in the controller 1010. The memory device 1030 includes a semiconductor device including a FIN type FET described above. For example, the memory device 1030 may include the semiconductor device 200 described above.

The interface 1040 may be a data transmission path between the system 1000 and another external device. The controller 1010, the input/output device 1020, the memory device 1030, and the interface 1040 may communicate with one another via, for example, a bus 1050. The system 1000 may be used in, for example, a mobile phone, an MP3 player, a navigation device, a portable multimedia player (PMP), a solid state disk (SSD), or household appliances.

Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A method of manufacturing a semiconductor device, the method comprising:
    forming a plurality of conductive lines separated from one another in a first direction via a slender hole and extending in a second direction perpendicular to the first direction;
    forming a first insulation layer filling the slender hole between the plurality of conductive lines;
    forming a plurality of first isolated holes separated from one another between the plurality of conductive lines in the first direction and the second direction by patterning the first insulation layer;
    forming a liner layer in the first isolated holes, wherein the liner layer compensates for a vertical profile of the first isolated holes and has an etching selectivity with respect to the first insulation layer;
    filling a second insulation layer having an etching selectivity with respect to the first insulation layer, in the first isolated holes on the liner layer; and
    forming a plurality of second isolated holes between the conductive lines by removing the first insulation layer using the etching selectivity between the second insulation layer and the first insulation layer.

2. The method of claim 1, wherein in the forming of the plurality of first isolated holes, a curved portion is formed in the first isolated holes.

3. The method of claim 2, wherein in the forming of the second insulation layer, the liner layer is filled in the curved portion formed in the first isolated holes.

4. The method of claim 1, wherein the forming of the plurality of first isolated holes comprises:
    forming a mask layer on the first insulation layer; and
    forming a curved portion in the plurality of first isolated holes by etching the first insulation layer using the mask layer as an etching mask.

5. The method of claim 4, wherein the forming of the liner layer and the second insulation layer comprises:
    forming the liner layer on the curved portion, an inner side wall and a bottom of the first isolated holes;
    etching the liner layer to form a patterned liner layer filling in the curved portion; and
    forming an insulation material on the patterned liner layer, thereby filling the first isolated holes.

6. The method of claim 4, further comprising, after forming the first isolated holes, recessing the mask layer by etching the mask layer outside the first isolated holes.

7. The method of claim 1, wherein the first insulation layer comprises an oxide layer, and the second insulation layer comprises a nitride layer.

8. The method of claim 1, wherein a separation distance between the second isolated holes in the first direction is determined according to a width of the conductive lines, and a separation distance between the second isolated holes in the second direction is determined according to a width of the second insulation layer.

9. The method of claim 1, wherein the second insulation layer has an etching selectivity with respect to the liner layer, and the liner layer is removed by using the etching selectivity between the liner layer and the second insulation layer after removing the first insulation layer.

10. The method of claim 1, further comprising forming a contact plug filling in the second isolated holes after forming the second isolated holes.

11. A method of manufacturing a semiconductor device, the method comprising:
    forming a plurality of active regions separated from one another, on a substrate;
    forming a plurality of word lines across the plurality of active regions in a first direction and separated from one another in a second direction perpendicular to the first direction;
    forming a plurality of first contact plugs on the active regions, wherein the first contact plugs are insulated from an interlayer insulation layer;
    forming a plurality of bit lines electrically connected to the first contact plugs and across the word lines and a slender hole between the bit lines;
    forming a first insulation layer filling the slender hole between the bit lines;
    forming a plurality of first isolated holes separated from one another between the bit lines in the first direction and the second direction, by patterning the first insulation layer;
    forming a liner layer in the first isolated holes, wherein the liner layer compensates for a vertical profile of the first isolated holes and has an etching selectivity with respect to the first insulation layer;
    filling a second insulation layer in the first isolated holes on the liner layer, wherein the second insulation layer has an etching selectivity with respect to the first insulation layer;
    forming a plurality of second isolated holes between the bit lines by removing the first insulation layer using the etching selectivity between the second insulation layer and the first insulation layer; and
    forming a second contact plug filling in the second isolated holes.

12. The method of claim 11, wherein the plurality of word lines are filled in a word line trench that is formed by etching the active regions and the word lines are formed on the active regions.

13. The method of claim 12, wherein the first contact plugs are formed at a level higher than the word lines.

14. The method of claim 11, wherein the forming of the first isolated holes comprises:
    forming a mask layer on the first insulation layer; and forming a curved portion in the first isolated holes by etching the first insulation layer using the mask layer as an etching mask, wherein the forming of the liner layer and the second insulation layer comprises:

forming the liner layer on the curved portion, an inner side wall and a bottom of the first isolated holes;

etching the liner layer to form a patterned liner layer filling in the curved portion; and forming an insulation material on the patterned liner layer filling the first isolated holes.

15. The method of claim 14, further comprising, after forming the first isolated holes, recessing the mask layer outside the first isolated holes by etching the mask layer.

16. A method of manufacturing a semiconductor device, the method comprising:

forming a device isolation trench having a plurality of device isolation regions therein in a substrate, thereby defining a plurality of active regions via the device isolation regions;

forming a plurality of word line trenches in the substrate which extend parallel to one another and cross the active regions;

sequentially forming a gate dielectric layer, a word line and a buried insulating layer in the word line trenches, wherein the word lines are disposed across the active regions in a first direction and are separated from one another in a second direction perpendicular to the first direction;

forming a first interlayer insulation layer on the buried insulating layer;

forming a second interlayer insulation layer on the first interlayer insulation layer;

forming a plurality of direct contacts in the first and second interlayer insulation layers which are electrically connected to a source region of the active regions;

forming a plurality of bit line stack structures which extend parallel to one another above the first and second interlayer insulation layers and the plurality of direct contacts, wherein the bit line stack structures include a plurality of bit lines disposed across the word lines and electrically connected to the direct contacts and a plurality of insulation capping lines that cover an upper surface of the bit lines, wherein the insulation capping lines are thicker than the bit lines;

forming a plurality of slender holes between the bit lines of adjacent bit line stack structures;

forming an insulation liner which covers exposed upper surfaces and exposed sidewalls of the bit line stack structures and an exposed upper surface of the second interlayer insulation layer;

forming a plurality of spacers covering the insulation liner on opposing sidewalls of the bit line stack structures;

forming a first insulation layer filling the slender holes between the adjacent bit line stack structures;

forming a mask pattern on the bit line stack structures, the first insulation layer and the insulation liner, thereby exposing a portion of the first insulation layer via the mask pattern;

etching the exposed portion of the first insulation layer using the mask pattern as an etching mask to form a plurality of patterned first insulation layers and a plurality of first isolated holes between the patterned first insulation layers and between the bit line stack structures, wherein the first isolated holes are separated from each other in the first and second directions by the patterned first insulation layers and the bit line stack structures;

etching an exposed portion of the insulation liner using the mask pattern as an etching mask to form a patterned insulation liner;

removing the mask pattern;

forming a plurality of second insulation layers filling the first isolated holes after removing the mask pattern, wherein the second insulation layers have an etch selectivity with respect to the patterned first insulation layers;

removing the patterned first insulation layers by using the etch selectivity between the second insulation layers and the patterned first insulation layers, thereby forming a plurality of second isolated holes between the bit line stack structures and between the second insulation layers, wherein the second isolated holes are separated from each other via the second insulation layers and the bit line stack structures; and forming a plurality of second contact plugs filling the second isolated holes.

17. The method claim 16, wherein the forming of the bit line stack structure comprises:

sequentially forming a conductive layer and a capping insulation layer covering the conductive layer on the first and second interlayer insulation layers, wherein the capping insulation layer is thicker than the conductive layer;

patterning the capping insulation layer to form the plurality of insulation capping lines; and etching the conductive layer using the insulation capping lines as an etching mask to form the plurality of bit lines.

18. The method of claim 17, wherein upper surfaces of the word lines are disposed at a lower level than an upper surface of the substrate.

19. The method of claim 16, wherein an upper surface of the buried insulation layer is disposed at approximately a same level as an upper surface of the substrate, and wherein the buried insulation layer includes a material selected from the group consisting of a silicon oxide layer, a silicon nitride layer, a silicon oxynitride layer, or a combination thereof.

20. The method of claim 16, wherein the slender holes are in the form of a line and wherein a width of the slender holes in the first direction is narrower than a width of the slender holes in the second direction.

* * * * *